May 22, 1956 R. HEELEY 2,746,041

INSERTING MACHINES HAVING ROTARY ANVILS

Filed March 24, 1955 4 Sheets-Sheet 1

Inventor
Roland Heeley
By his Attorney

May 22, 1956 R. HEELEY 2,746,041

INSERTING MACHINES HAVING ROTARY ANVILS

Filed March 24, 1955

4 Sheets-Sheet 2

Inventor
Roland Heeley
By his Attorney

May 22, 1956 R. HEELEY 2,746,041

INSERTING MACHINES HAVING ROTARY ANVILS

Filed March 24, 1955 4 Sheets-Sheet 3

Inventor
Roland Heeley
By his Attorney

INSERTING MACHINES HAVING ROTARY ANVILS

Inventor
Roland Heeley
By his Attorney

United States Patent Office 2,746,041

Patented May 22, 1956

2,746,041

INSERTING MACHINES HAVING ROTARY ANVILS

Roland Heeley, Beverly, Mass., assignor to United Shoe Machinery Corporation, Flemington, N. J., a corporation of New Jersey Application March 24, 1955, Serial No. 496,544

6 Claims. (Cl. 1—2)

This invention relates to machines for inserting and securing fastener elements and is more particularly concerned with providing a machine for securing components on a chassis by clinching their terminals in an improved manner. The invention is herein illustrated as applied to a machine for inserting the leads of electronic components into and through holes formed in a wiring board bearing a printed circuit, the machine having anvil mechanism acting automatically to clinch the inserted leads against a surface of the wiring board. It will be recognized that in various novel aspects the invention is not limited to the securing of electrical elements but may be applicable to clinching single- or multi-prong type fasteners, for instance, staples, whether serving an electrical function or not.

The electronics industry in recent years has appreciated the many practical advantages to be gained from the mechanical assembly of standardized electrical components on printed circuit bearing panels or wiring boards. A large number of the leads or terminals of these components often protrude from one side of a board and lie substantially in a plane, thus advantageously lending themselves to being simultaneously united permanently in the assemblage by dip soldering. Regardless of whether the dip soldering technique is or is not employed, it is important that an initial mechanical connection be effective on each component accurately to tie it into a circuit and hold it securely despite rough usage, vibration, etc. A copending application filed September 27, 1954, in the names of L. D. Alderman, C. P. Cardani, E. S. Kant, and H. B. Kimball, and bearing Serial No. 458,312, discloses a machine for inserting coaxial lead type components in wiring boards, the leads of each successive component, for example a one-half watt resistor, being cut, formed in staple fashion, and then inserted endwise through preformed wiring board holes. As therein shown a reciprocable anvil operating in time relation to the reciprocal lead inserting instrumentalities of the machine is arranged to engage both leads by movement parallel with their inserted length and substantially normal to a wiring board to bend and thereby secure them. The clinch so obtained will, depending on the form of the anvil used, spread the lead ends or move them together or in different directions. The nature of the grip of a component on a chassis when its leads or prongs are clinched as just indicated is not always sufficiently tight and may in some cases result in a lead or prong being partially and detrimentally thrust back out of its hole. Experience has shown that clinches of the type described may be quite satisfactory in certain electronic assemblages but that other electronic work, especially the more critical types, requires what may be termed a flatter clinch, that is, one in which the inserted leads are bent into closer gripping relation with a chassis surface and are not subjected to being displaced endwise by a force which would tend to release their grip. Since the problem involved is not limited to the securing of leads, tabs, prongs, or even electrical terminals or connectors, but includes the clinching of such elements as single- or multi-leg fasteners, it will be understood that the term "lead" or "leads" as used hereinafter, is intended in a comprehensive sense.

In view of the above and other considerations it is a general object of this invention to provide, in a machine adapted to install on a work piece an article having a lead or leads to be inserted endwise therethrough, improved rotary lead clinching means whereby an inserted lead is wiped into firm gripping relation with the work piece by a force acting substantially parallel to a surface thereof. In accordance with this object and as a feature of the invention, the illustrative component inserting machine is herein shown as being provided with an anvil having spaced clinching portions rotatable in a plane parallel and adjacent to the surface of a wiring board from which the leads to be clinched protrude, said portions being disposed to engage the inserted leads respectively of a component to bend and wipe them into close relation with said surface. The clearance afforded by the wiring board holes for the inserted leads being of the order of only a few thousandths of an inch, no harmful force can be transmitted by a lead being wiped into clinching relation to harm a component body. Each lead is thus rather sharply bent only at a portion closely adjacent to the edge of the wiring board hole, the operating plane of said clinching portions being spaced therefrom by a distance substantially equal to the diameter of the leads.

In accordance with another feature of the invention and as hereinafter shown, the illustrative machine includes means for moving a component into predetermined position on a wiring board and for thrusting the leads of the component endwise through holes in the wiring board, mechanism for cyclically operating said means, a rotatably mounted anvil movable relatively to the wiring board and into and out of operative relation with the inserted leads of successive components, and means controlled by said mechanism for actuating said anvil to wipe the leads when fully inserted into flat clinching relation with the wiring board.

The above and other features of the invention, together with novel details and combinations of parts, will now be more fully described in connection with an exemplary machine in which they are embodied and with reference to the accompanying drawings thereof, in which.

Figure 4:
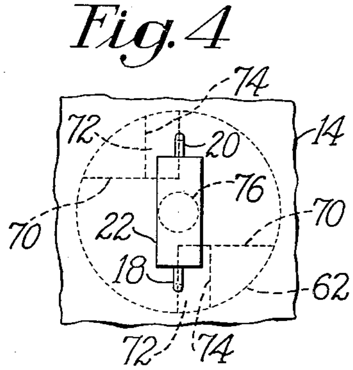
Fig. 4 is a plan view of an inserted component and an anvil raised into position to be rotated for clinching.
Figure 6:
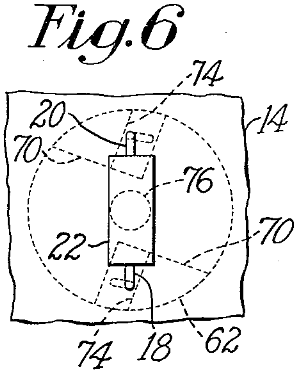
Figure 8:
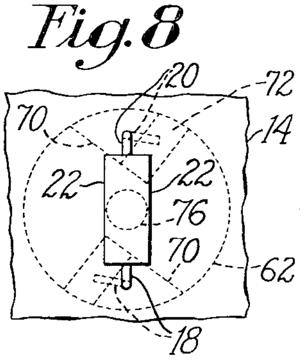
Figure 5:
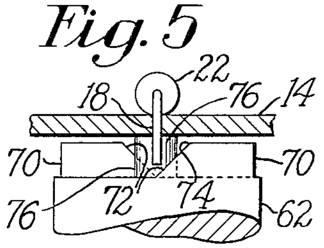
Fig. 5 is a view in side elevation of the parts shown in Fig. 4.
Figure 7:
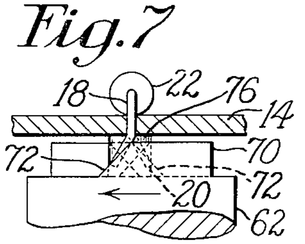
Figure 9:
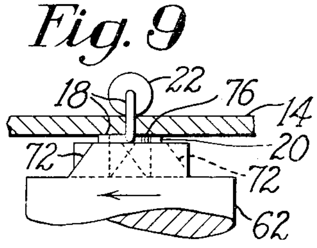
Figure 10:
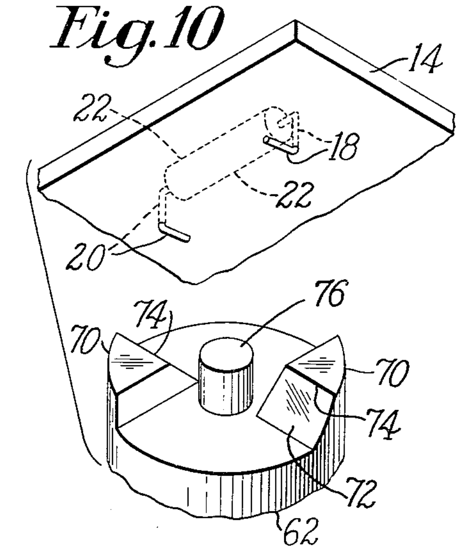
Figure 11:
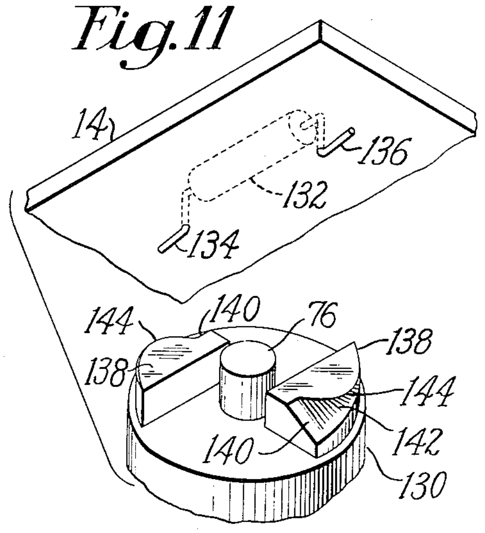

Figs. 6 and 7, and 8 and 9, correspond with Figs. 4 and 5, respectively, but show the parts in progressive intermediate stages of rotary clinching;

Fig. 10 is a perspective view of the fully secured component and the anvil when retracted and returned to its starting position, and Fig. 11 is a perspective view corresponding to Fig. 10, but indicating the flat clinching obtained when an alternate form of rotary anvil is employed, the clinching surfaces being helical.

In view of the general similarity of the illustrative machine to that fully disclosed and explained in the copending Alderman et al. application, only so much of the common mechanism in these machines as is necessary to a full understanding of the present invention will herein be described. The illustrative component inserting machine includes a hollow main C-frame 10 (Fig. 1) adjustably supporting a head 12 having lead cutting, forming, and inserting mechanism therein as set forth in the application above cited. Housed in the base of the frame are pneumatic means for driving that mechanism and, toward the front of the machine, lead clinching mechanism later to be described. While a chassis or printed wiring board 14 for mounting electronic parts, for example coaxial lead type components 16, may be positioned by any suitable means between the head 12 and the lead clinching mechanism in readiness to receive the leads 18, 20 (Figs. 3 and 4) of a component having a body 22, it will suffice for purposes of illustration in this regard merely to show (Fig. 1) and briefly describe a portion of the conveyor and associated positioning means by which the lead-receiving holes of a wiring board 14 are brought into register with the head, and more particularly into register with the path of a reciprocable driver bar 24 (Fig. 3) mounted in the head and by which successive cut and formed components are located on the wiring boards. Thus, the wiring board 14 is in this case detachably mounted on a pallet 26 (Fig. 1) having the form of an open rectangular frame, the pallet being carried to and from operative position by a pair of spaced conveyor belts 28, 28, and being fixedly located by means including a channel bar 30 and pallet pin 32 cooperative therewith, and abutments 34, 35.

For cyclically operating the lead cutting, forming, and inserting instrumentalities, as well as for feeding successive components 16 to these instrumentalities by means of a pair of sprockets 36 (one shown in Fig. 1), the machine is provided with an air cylinder or motor 38 connected by a pipe 40 to a solenoid operated three-way valve 41 which acts to control delivery from a source of air under pressure, blocking an inlet at an appropriate time in the cycle, i. e. after a power stroke, and opening an exhaust port (not shown). This motor has its vertical piston rod 42 threaded into the lower end of a link 44 which is thereby raised against the resistance of a return spring 45 to actuate linkage for operating the driver bar 24 and the forming instrumentalities in proper sequence to install successive components in readiness for clinching.

Figure 1:
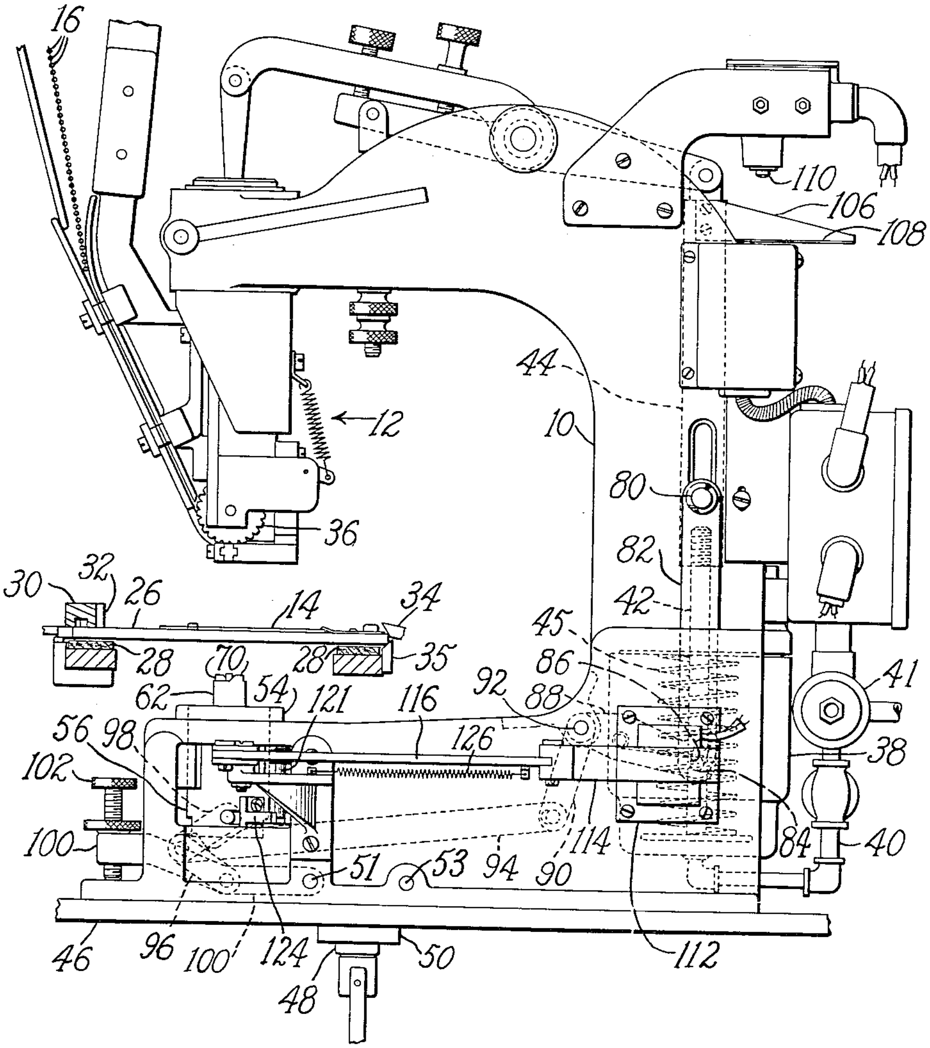
Fig. 1 is a view in side elevation of the illustrative component inserting machine in rest condition and which, except for a portion of the novel anvil operating mechanism and controls hereinafter to be noted, corresponds in general to the illustrative machine fully disclosed and claimed in the copending application referred to above.
Figure 2:
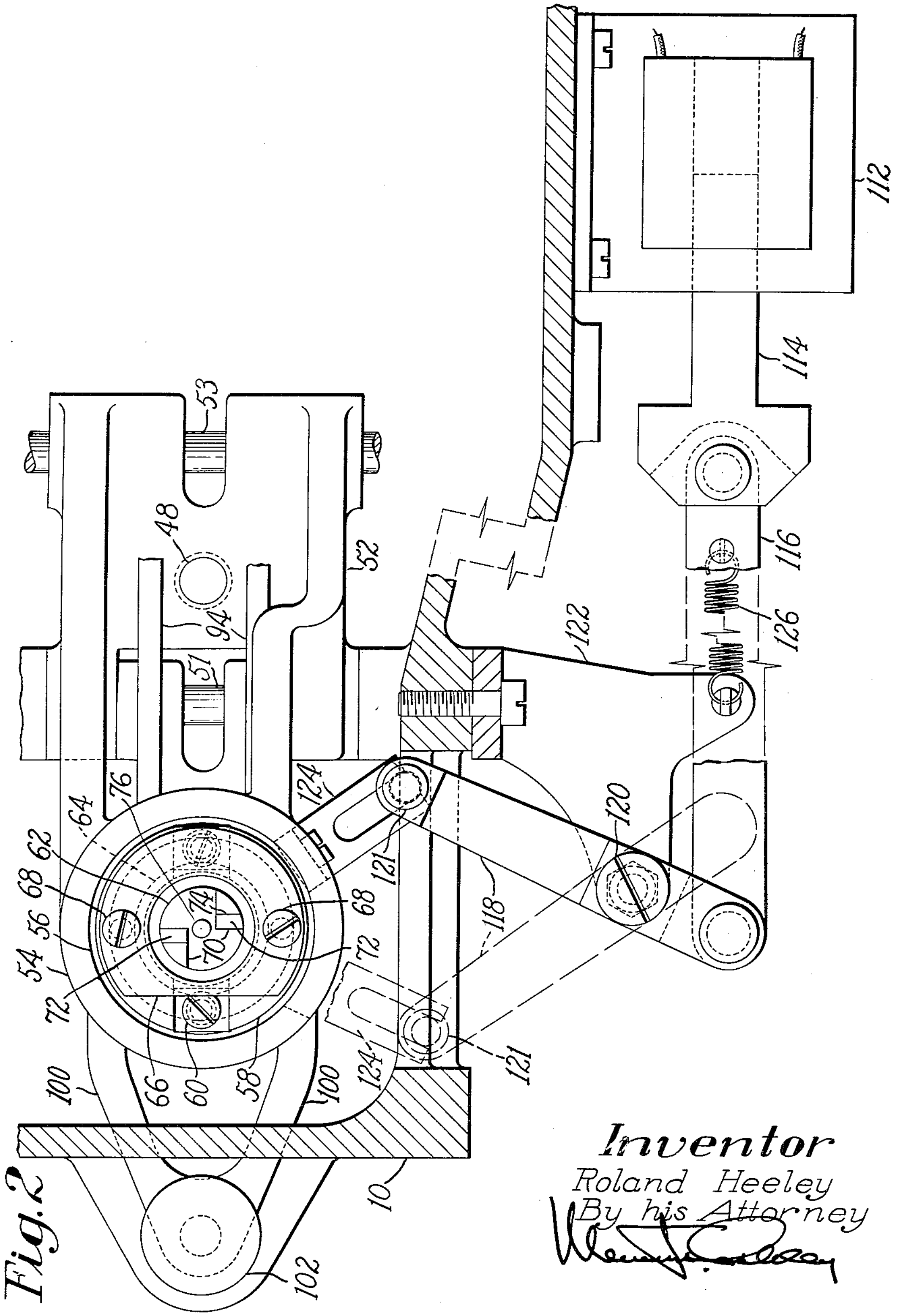
Fig. 2 is a plan view on a larger scale of the anvil and part of its operating mechanism shown in Fig. 1.
Figure 3:
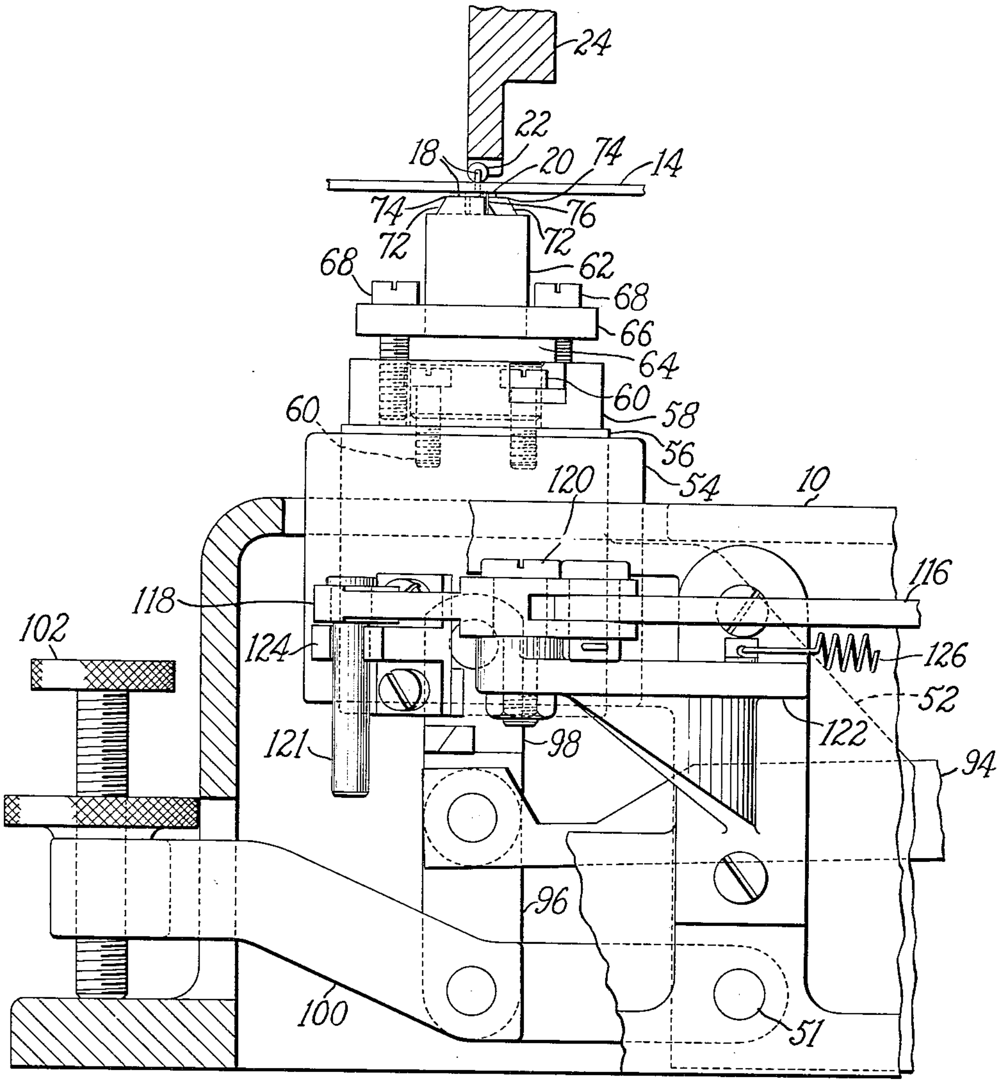
Fig. 3 is a view in side elevation, partly in section and on an enlarged scale, of the anvil mechanism shown in Fig. 1 (with a portion broken away) and in its operative position upon flat clinching the leads of a coaxial lead type component.

In order to enable the machine to be approximately shifted with respect to the located wiring boards, i. e., suitably to register the head 12 with the preformed lead receiving holes in a located board, as disclosed in said copending application, the frame 10 is adjustably secured about an opening in a horizontal plate 46 (Fig. 1) constituting part of a conveyor frame or other suitable supporting means. For this purpose a clamping bolt 48 extends through a cross bar 50 spanning the plate opening and has its upper end threaded into an anvil housing bracket 52 (Figs. 2 and 3). The latter is bored to receive a pair of supporting rods 51, 53, which respectively extend into opposite sides of the C-frame. The bracket 52 has a cylindrical portion 54 which partially encloses and guides anvil mechanism now to be described. This mechanism, in addition to being vertically movable into and out of lead engaging position as disclosed in the Alderman et al. application, is also rotatable in its raised position for reasons to be explained. Slidable heightwise in the cylindrical portion 54 is a hollow piston 56 (Fig. 3) to the upper end of which an adjusting plate or adapter 58 is secured by a pair of recessed screws 60 (one shown in Fig. 2). To permit accurate alinement of the vertical axis of the piston 56 with that of the head 12, the holes in the adapter receiving the screws 60 are sufficiently large to permit appropriate relative horizontal adjusting movement of the adapter. An anvil 62 is provided with an enlarged base 64 that fits into the upper end of the adapter 58, a slashed-off washer 66 overlying the base 64 and serving to clamp the anvil in adjusted fixed position by means of a pair of clamping screws 68, 68 extending through the washer and threaded into the adapter. The purpose of slabbing off the washer 66 is simply to avoid interference with an inner margin of the pallet if it is desired to insert a component adjacent to an edge of a wiring board.

Formed integral with the upper end of the anvil 62 are two diametrically disposed, upstanding flat-topped lead-engaging portions 70, 70, each having an oppositely inclined, radially extending surface 72 that is adapted, when in its uppermost position, to contact an inserted lead end. Upper edges 74 of the surfaces 72 are swung in a plane when the anvil is raised, as will hereinafter be explained, to bend and wipe the inserted leads into tight gripping relation with the under side of the wiring board. A central upstanding projection 76 of the anvil is arranged to abut the wiring board substantially beneath an intermediate point in the length of the installed component body 22, the projection 76 extending heightwise above the wiping plane of the edges 74 by approximately the diameter of the leads 18, 20 (Figs. 3 and 4) to assure their being laid flat against the wiring board.

The means by which the anvil mechanism is moved heightwise during lead cutting, forming and insertion, though similar to what has been fully set forth in the Alderman et al. application, will now be briefly described. A horizontal rod 80 (Fig. 1) extending through vertical slots formed in the frame 10 is carried heightwise by the link 44. Suspended from opposite ends of the rod 80 are a pair of links 82 (one shown), the lower ends of which respectively have a pin 84 that is received in a lost motion slot 86 in each of a pair of rearwardly extending arms 88 of a bell crank lever 90. The latter is pivoted on the C-frame at 92 and has a forwardly extending arm pivotally connected to corresponding longitudinally slotted ends of a pair of parallel toggle operating bars 94 (one shown). Front ends of these bars are connected to the knee joint of a toggle comprising links 96, 98. For adjustably determining the upper limit of the movement of the anvil 62, the piston 56 has a wrist pin connection with the upper end of the link 98, the link 96 has its lower end pivotally supported by a lever 100 which is itself pivotally mounted at one end on the rod 51 and a knurled adjusting screw 102 abutting the frame 10 endwire is threadedly received by the forward end of the lever 100. By turning the screw 102 the limit of upward movement of the anvil may be varied to allow for such factors as the bowing of wiring boards, different thicknesses of leads, etc. From the foregoing it will be appreciated that the motor 38 acts during its power stroke to lift the link 44 to cut, form, and install an unclinched component, the anvil projection 76 being raised during the latter part of this action and upon straightening of the toggle 96, 98, to engage the under side of the wiring board as the formed leads are being thrust downwardly therethrough. With the anvil surfaces 72 thus brought into initial light contact or close proximity with the inserted lead ends and the component being held against the upper side of the wiring board by engagement of the driver bar 24 with the coaxial unformed portions of the leads as indicated in Fig. 3, the anvil 62 is automatically rotated by mechanism next to be described to effect flat clinching.

Secured to the link 44 is an arm 106 (Fig. 1) having a surface 108 arranged yieldingly to displace a switch button 110 to close an electric circuit by which a solenoid 112 (Figs. 1 and 2) mounted on the frame 10 is energized. The arrangement shown is such that when the formed leads have been fully inserted the solenoid forces its plunger 114 and a link 116 connected thereto to the right (as shown in Figs. 1, 2, and 3). The link 116 is connected to one end of an anvil operating lever 118 that extends through an opening in the base of the frame 10 and is fulcrumed on a pivot stud 120 supported by a bracket 122 fast on the frame. The other end of the lever 118 carries a vertical pin 121 which is received by the forked end of an arm 124 secured to the piston 56, the pin 121 being of sufficient length to be received by the arm throughout the range of its heightwise movement. Accordingly, on being raised the anvil 62 is automatically rotated (about 60°) clockwise (as viewed from above, Fig. 2) by energization of the solenoid 112, the surfaces 72 first bending their adjacent protruding leads about the lower edge of their wiring board holes and the edges 74 simultaneously moving arcuately in a plane respectively to engage and wipe the adjacent protruding leads in nearly opposite directions, transversely of the component body, and into tight gripping relation with the board 14. It will be apparent that the flat clinching thus obtained holds the component body securely against movement relatively to the board, and the leads are advantageously disposed to be fully embedded in dip soldering if and when a dip or other soldering technique is thereafter employed.

As explained in the aforementioned copending application, electrical means permitting exhaust via the valve 41 and operation of the return spring 45 are provided for effecting automatic retraction of the driver bar after it has completed its inserting down stroke in a cycle of the machine. The consequent lowering of the link 44 is effective both to break the straightened toggle 96, 98 (through the links 82, the lever 90, and the bars 94) for lowering the anvil, and to release the switch button 110 that opens the control circuit to de-energize the solenoid 112. Accordingly, toward the close of the machine cycle when this solenoid has been de-energized a spring 126 having one end affixed to the bracket 122 and its other end connected to the link 116 acts through the latter to return the anvil 62 counterclockwise as viewed from above to its starting position, the spring 124 having been previously loaded during operation of the solenoid plunger to shift the link 116 to the right.

It will be appreciated that the above described mounting of the anvil 62 is such as to render it conveniently detachable in order that an anvil having differently shaped clinching portions may be substituted for acting on leads, prongs, tabs, etc which may be differently disposed and differ in number and/or the desired direction of flat clinching. Normally the number of upstanding, rotary clinching portions of an anvil will correspond with the number of elements to be simultaneously clinched, and with their relative positions, in order to be placed in juxtaposition with the leads when rotary clinching is to commence. Fig. 11 discloses, by way of example, one differently shaped anvil 130 and a component 132 clinched thereby. In this instance leads 134, 136 are spread apart and wiped against the under surface of the wiring board 14 by upstanding anvil portions 138, 138, respectively. Each portion 138 has a sloping (preferably about 45°), radially extending surface 140 and an adjoining helical clinching surface 142. An upper wiping edge 144 of the surface 142 need not be angular as shown, but may be rounded. The installed component being backed up by the driver bar 24 as before, operation of the anvil 130 is much like that of the anvil 62. Thus, on being raised so that projection 76, which extends above the portions 138 by substantially the thickness of a lead 134 or 136, abuts the wiring board beneath the component 132, a protruding lead end will be adjacent to a surface 140, and an inner part of a surface 142. The anvil 130 is then rotated clockwise (as viewed from above) to cause the surfaces 142 to engage the leads 134, 136 sidewise, respectively, and progressively bend them apart, outwardly from the component body and substantially in the direction of its length. Advantageously, the leads 134, 136 are bent about the lower edge of their lead-receiving holes in the wiring board, the clinching force as in the previous case acting parallel with the under surface of the board, first on the end of the protruding lead and then nearer to said surface, until the leads are wiped by the edges 144 into substantially flat clinching relation therewith.

It will be apparent that many modifications may be made in the contour of the rotary anvil to suit it to operation on particular terminals or elements to be secured by clinching-wiping action. Probably two primary benefits to be had from these modifications and the examples herein described are: tight clinching without strain to either the work piece or the component, and smoothness of operation.

Having thus described my invention, what I claim as new and desire to secure by Letters Patent of the United States is:

1. A machine for securing to a chassis an article having a lead to be inserted therethrough comprising means for installing the article in predetermined relation to the chassis and with said lead protruding from a surface thereof, a rotatable anvil disposed on the opposite side of the chassis from the installing means, said anvil being mounted for movement toward and from said chassis surface and having a lead-wiping surface inclined thereto, and means for moving said anvil relatively to said chassis surface first to place said wiping surface adjacent to the protruding lead and at a predetermined distance from the chassis surface and then to rotate the anvil whereby its wiping surface bends and wipes said lead into flat clinching relation with the chassis.

2. A machine for securing to a chassis an article having a lead to be inserted therethrough comprising means for installing the article in predetermined relation to the chassis and with said lead protruding from a surface thereof, mechanism for operating said installing means cyclically, a rotatable anvil disposed on the opposite side of the chassis from the installing means, said anvil being mounted for movement toward and from said chassis surface and having a lead-wiping surface inclined thereto, and means for moving said anvil relatively to said chassis surface first to place said wiping surface adjacent to the protruding lead and at a predetermined distance from the chassis surface and then to rotate the anvil whereby its wiping surface bends and wipes said lead into flat clinching relation with the chassis, said anvil moving means being operatively connected to said mechanism to actuate the anvil in time relation to said installing means.

3. In a machine for securing to one side of a chassis a component having a pair of leads respectively extending through holes in the chassis and protruding from another side thereof, an anvil movably mounted adjacent to that other side, said anvil having a pair of radially extending and oppositely inclined clinching portions, and means to move the anvil about an axis extending between said portions whereby they are oppositely swung to engage said protruding leads sidewise to bend them about edges of their respective holes, said portions respectively having lead-wiping surfaces spaced during their swinging movement approximately the thickness of the lead from said other side of the chassis.

4. In a machine for securing axial lead-type components on a chassis, means for supporting a chassis, axially reciprocable mechanism on one side of the supported chassis for cyclically forming and installing successive components with their leads inserted through predetermined portions of the chassis to protrude from its other side, a rotary anvil mounted for axial reciprocation toward and from a clinching position in close proximity to said other side of the chassis, means for operating said mechanism and said anvil in time relation, said anvil having clinching surfaces formed to force the inserted leads only sidewise respectively, each clinching surface having an edge substantially parallel with said other side of the chassis, and means for rotating the anvil about its axis whereby said edge of each clinching surface wipes the adjacent inserted lead into close gripping relation with the chassis.

5. In a machine for securing to a work piece a lead inserted therethrough and extending endwise therefrom, an anvil mounted for turning movement about an axis normal to the work piece, said anvil having a helical clinching surface arranged to engage the protruding portion of said lead to bend it sidewise and then wipe it into flat clinching relation with the work piece.

6. In a machine for securing to a work piece a lead inserted therethrough and extending endwise therefrom, an anvil mounted for movement adjacent to the work piece to clinch the protruding lead end, said anvil having a clinching surface extending in a curve and with changing slope, the portion of said surface having most slope being disposed initially to engage the protruding portion of said lead end to deflect it at an angle to the plane of the work piece and the surface portions of less slope then being disposed progressively to bend the deflected portion toward and press it against the work piece.

References Cited in the file of this patent

UNITED STATES PATENTS 136,340 Shorey ---------------- Feb. 25, 1873